United States Patent
Li

(10) Patent No.: US 6,836,435 B2
(45) Date of Patent: Dec. 28, 2004

(54) COMPACTION SCHEME IN NVM

(75) Inventor: Chi Nan Brian Li, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 27 days.

(21) Appl. No.: 10/319,664

(22) Filed: Dec. 13, 2002

(65) Prior Publication Data

US 2004/0114437 A1 Jun. 17, 2004

(51) Int. Cl.$^7$ .............................................. G11C 16/00
(52) U.S. Cl. ........................... 365/185.29; 365/185.24; 365/185.22
(58) Field of Search ..................... 365/185.29, 185.3, 365/185.22, 185.24

(56) References Cited

U.S. PATENT DOCUMENTS

| | | | |
|---|---|---|---|
| 5,400,286 A | * 3/1995 | Chu et al. | 365/185.19 |
| 5,510,638 A | 4/1996 | Lancaster et al. | 257/314 |
| 6,091,642 A | * 7/2000 | Pasotti et al. | 365/185.29 |
| 6,236,609 B1 | 5/2001 | Tanzawa et al. | 365/218 |
| 6,335,882 B1 | 1/2002 | Saeki et al. | 365/185.29 |
| 6,594,178 B2 | * 7/2003 | Choi et al. | 365/185.17 |

OTHER PUBLICATIONS

Yamada et al., "A Self–Convergence Erasing Scheme for a Simple Stacked Gate Flash EEPROM," IEEE, pp. 11.4.1–11.4.4 (1991).

* cited by examiner

Primary Examiner—Tan T. Nguyen

(57) ABSTRACT

A method of erasing a semiconductor nonvolatile memory (NVM) so as to compact the distribution of cell erased threshold voltages within a restricted range around a target erased threshold voltage. Erase pulses are applied to NVM cells until a determination is made by, for example, sensing total column source current that adequate erasure has been realized. An optional soft program signal may be applied subsequent to each erase pulse in order to impede over-erasure. Once erasure has been verified, the distribution of erased threshold voltages is compacted by sustaining, for a predetermined length of time, the simultaneous application of a gate voltage that is equal to the target erased threshold voltage and a highly positive drain voltage.

19 Claims, 3 Drawing Sheets

COMPACTION SCHEME IN NVM

BACKGROUND OF THE INVENTION

1. Field of the Invention

The subject invention relates generally to the operation of a semiconductor nonvolatile memory (NVM) and, in particular, to a method of erasing an NVM so as to more tightly control the value of the threshold voltage imparted to the NVM cell as a result of an erase operation.

2. Related Art

Semiconductor NVMs, and particularly electrically erasable, programmable read-only memories (EEPROMs), exhibit widespread applicability in a range of electronic equipments from computers, to telecommunications hardware, to consumer appliances. In general, EEPROMs serve a niche in the NVM space as a mechanism for storing firmware and data that must be refreshed periodically in situ. The EEPROM's precursor, the EPROM, can be erased only through UV irradiation and therefore requires removal from its target system prior to erasure. The flash EEPROM may be regarded as a specifically configured EEPROM that may be erased only on a global or sector-by-sector basis. The typical flash EEPROM may be divided into sectors of 64K (65, 536) words. The sacrifice in flash EEPROM erase selectivity is exchanged for a simplified memory cell design, which, in the limit, may require only a single MOS transistor.

As is well known to those skilled in the art, NVM cells are typically constructed by forming a field effect transistor (FET) in a body of semiconductor material, usually silicon. In one configuration, the FET can be made to store electrical charge (holes or electrons) in a separate gate electrode, referred to as a floating gate. Alternatively, in the SONOS NVM cell architecture, the gate structure includes an oxide-nitride-oxide (ONO) dielectric stack. Charge is stored in the nitride layer that is separated from the silicon substrate by a bottom oxide layer and from a polysilicon gate conductor by a top oxide layer. In addition, the Q-flash NVM cell is predicated on a layer of isolated polycrystalline storage islands that are formed underneath a control gate electrode.

Data is stored in an NVM cell by modulating the threshold voltage, $V_T$, of the FET through the injection of charge carriers into the charge-storage layer from the channel of the FET. For example, with respect to an N-channel, enhancement-mode FET, an accumulation of electrons in the floating gate, or in a dielectric layer above the FET channel region, causes the FET to exhibit a relatively high $V_T$. When the FET control gate is biased to the voltage required to read stored data, i.e., to a "READ" voltage, the FET will fail to conduct current because its then-existing threshold voltage is greater than the voltage applied to the gate. The nonconductive state of the FET may, by convention, be defined and detected as a logic level ONE. Conversely, a reduction in the concentration of electrons in the floating gate or in the nitride layer of a SONOS cell, or in the isolated island storage layer of a Q-flash cell, will cause the FET threshold voltage to diminish, and, in some designs, become negative with respect to ground. In this case, applying the READ voltage to the FET control gate will cause the FET to conduct current from drain to source. In some designs, the FET $V_T$ may be made negative so that an applied READ voltage of 0V will nonetheless be sufficient to cause current conduction by the FET. Current conduction by the FET may be defined and detected as a logic level ZERO. (It should be noted that NVM systems are also designed to adopt an opposite logic convention in which enduction corresponds to a logic ONE and nonconduction corresponds to a logic ZERO.)

The EEPROM is encountered in numerous configurations. In general, those configurations may be classified according to (i) the nature (i.e., thickness and composition) of the layer used to store charge for $V_T$ modulation and (ii) the number of operative gate electrodes available to control the operation of the NVM cell. In particular, a floating-gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating").

In the operation of an EEPROM, it is regularly required that all or portion of the NVM be programmed (or re-programmed). Typically, a programming operation is anticipated by global erasure of all NVM cells in an array or in a sector. Physically, erasure of an NVM cell constitutes the neutralization of charge stored in the floating gate. In the case where an N-channel, enhancement-mode FET is assumed as the operative NVM cell technology, then erasure is effected by the injection of holes into the floating gate, or by the tunneling of electrons out of the floating gate, so as to neutralize electrons that had previously accumulated in charge-storage sites as a result of a programming operation.

Electrically, an erase operation is intended to impart to the NVM cell a reduced $V_T$. An ideal global erase procedure would leave all erased NVM cells in a block with an identically low $V_T$. However, in practice it is found that a global erase operation results in an approximately binomial distribution of cell erased threshold voltages, with cells having respective erased threshold voltages that are either higher or lower than the target erased $V_T$. As might be expected, the variance in erased threshold voltages is most troublesome at the extremities of the distribution. Because it will persist as nonconductive when the specified READ voltage is applied, an NVM cell with a high erased $V_T$ may be read speciously as a logic ONE. Conversely, an NVM cell with a low erased $V_T$ may remain somewhat conductive, even though unselected, thereby contributing to undesirable column leakage current. Furthermore, an over-erased NVM will present an excessive current load during programming, which may in fact lead to programming failures. Accordingly, numerous attempts have been made to circumvent deleterious operational effects that attend the often broad distribution of erased $V_T$ values of the cells in an NVM array.

In one approach, a "soft" programming step is performed subsequent to erasure of an NVM cell. That is, a positive bias voltage is briefly applied to the gates of cells in a manner that mildly stimulates hot-electron injection into the charge-storage layer of the NVM cell. Current limiting may be a component of a soft programming step. The essence of soft programming is to effect a limited increase in the threshold voltages of erased NVM cells so as to mitigate column leakage current of programmed cells and to preclude the leakage current contributed by unselected cells during a read operation. However, soft programming is deemed a less than optimal response to erasure anomalies in that it broadens the distribution in erased $V_T$. That is, no convergence of cell erased $V_T$ threshold voltage is achieved because soft programming merely shifts the threshold voltages of all cells toward the high-threshold direction. In addition, this approach requires bit-by-bit selection, which significantly slows the erase time.

Another attempt to remediate the distribution in erased $V_T$ requires the generation of two disparate, and selectable, erase threshold values, EVT1 and EVT2, respectively. When the erased threshold value is set at EVT2, the lower limit of the distribution in $V_T$ after an erase operation is higher than an over-erase threshold value, OEVT. When the erase threshold value is set at EVT1, the lower limit of the $V_T$ distribution after erase is EVTL, a value greater than OEVT. The applicable erase verify threshold values, EVT1 and EVT2, are switched depending on the operating mode of the memory array. During a program/erase test sequence, the applicable erase verify threshold value is EVT2. During normal operation, the applicable erase verify threshold value is EVT1. See U.S. Pat. No. 6,236,609, Nonvolatile Semiconductor Memory.

Another response to the wide variation in erased threshold voltages simply seeks to obviate read disturb phenomena by erasing cells to a negative $V_T$ As is known in the art, "read disturb" refers to a phenomenon in which the integrity of data stored in an NVM cell is compromised by the very attempt to access, or read, the data. Read disturb effects may be minimal for a single read event directed to a particular NVM cell. However, the aggregate effect of numerous read attempts may be to reverse the data stored in the cell. Physically this means that the number of carriers stored in the charge-storage layer is altered by a read attempt, so that an erased cell presents as having been programmed because, for example, the $V_T$ of the cell after erasure remains at the high end of the erased $V_T$ distribution. A negative $V_T$ permits reading with a gate at 0 volts, thereby avoiding read disturb anomalies. See U.S. Pat. No. 5,510,638, Field Shield Isolated EPROM.

Another attempt to mitigate problems arising from wide erase $V_T$ distribution is simply to increase the applied READ voltage. In order to read a cell that has been erased to a low $V_T$, a sufficiently high read current is needed to trip the sense amplifier. The READ voltage then must be sufficiently higher than the $V_T$ of the least erased bit in order to satisfy the read current requirements. If the erase $V_T$ distribution is too wide, the applied READ voltage must be increased accordingly. The READ voltage is typically required to be pumped from a low Vdd state by a charge pump. If READ voltage is required to be high, charge pumping introduces additional delay, thereby degrading read access speed.

From the above, one may fairly conclude that, heretofore, efforts directed at redressing the effects of the variations in erased $V_T$ values in the cells of an NVM array have proven largely exiguous. In large part, the remedial measures entertained to date are deficient in their common failure to directly address the source of the difficulties relating to erased cell threshold voltage. In the manner described below, the subject invention is preeminent in that, rather than merely mitigating collateral effects, the compaction scheme described herein results in substantial convergence in the values of erased cell threshold voltage.

BRIEF DESCRIPTION OF THE DRAWINGS

The subject Compaction Scheme in NVM cell may be better understood by, and its many features, advantages and capabilities made apparent to, those skilled in the art with reference to the Drawings that are briefly described immediately below and attached hereto, in the several Figures of which identical reference numerals (if any) refer to identical or similar elements and wherein.

Figure 1:
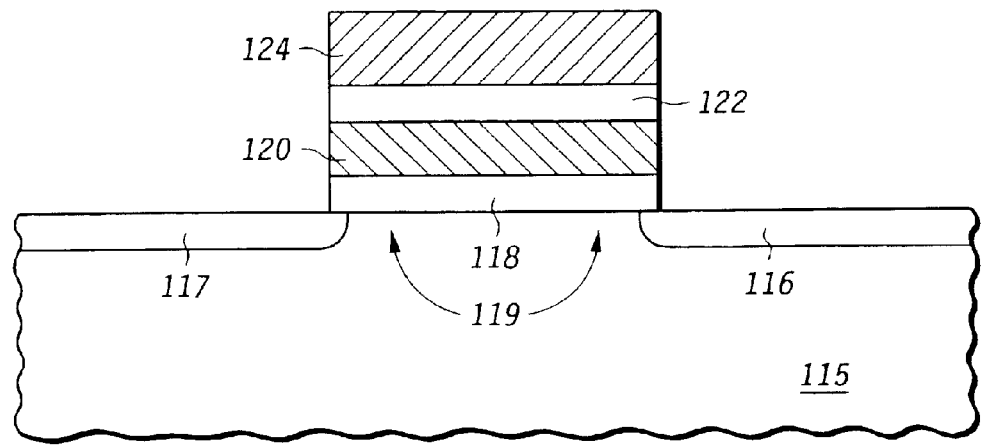
FIG. 1 is a cross-sectional view of SONOS NVM cell, in which there may be seen an uppermost polysilicon gate conductor (124) separated from a charge-storage nitride layer (120) by an oxide layer (122). Nitride layer (120) is separated from substrate (115) by oxide layer (118).

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF THE PREFERRED EMBODIMENT(s)

For a thorough understanding of the subject Compaction Scheme in NVM, reference is made to the following Detailed Description, which includes the appended Claims, in conjunction with the above-described Drawings.

In a manner that will be made imminently clear below, the subject invention subsists, in one form, in a method of erasing an NVM cell, or a number of NVM cells, in a manner so that the erased $V_T$ of the cell(s) more closely conforms to a target erased $V_T$. Convergence of the distribution of erased threshold voltages (i.e., compaction) extenuates operational difficulties that derive both from undesirably high erased $V_T$ (falsely read data) and undesirably low erased $V_T$ (column leakage current).

Directing attention to FIG. 1, depicted there is an NVM cell predicated on a particular thin-film storage construction. The NVM cell depicted in FIG. 1 relies on a thin film of, for example, silicon nitride for charge storage and data retention. The nitride film is sandwiched between two oxide layers and the resultant multilayered structure is disposed on a semiconductor substrate. The oxide-nitride-oxide (ONO) stack is clad with an uppermost layer of polysilicon. As indicated above, the acronym applied to this form of thin-film, floating-gate NVM construction is SONOS.

As seen in FIG. 1, in a typical embodiment, the SONOS NVM cell comprises a P-type substrate 115 in which there are formed an $N^+$ drain 116 and an $N^+$ source 117. Above the channel region 121 between drain 116 and source 117, there is deposited a layer 118 of silicon dioxide, preferably between 20 and 100 angstroms in thickness, forming an electrical isolation over the device channel. On top of silicon dioxide layer 118 is a silicon nitride layer 120, preferably approximately 100 angstroms thick. The silicon nitride forms a charge-storage (memory retention) layer of the SONOS cell, serving to trap hot electrons that are injected into the nitride layer. Another layer of silicon dioxide 122 is formed over the silicon nitride layer, preferably to a thickness of approximately 50 to 100 angstroms. Silicon dioxide layer 122 functions to electrically isolate a conductive gate 124 formed over the silicon dioxide layer 122. The layer forming the gate 124 typically is constructed from polysilicon. A salient feature of the SONOS NVM cell is the ONO stack that includes layers 118, 120, and 122.

In practical application, the NVM cell described above and depicted in FIG. 1 will be replicated numerous instances to form a memory array. A portion of such an array 20 is illustrated as the circuit diagram of FIG. 2. The memory cell arrangement depicted there is identifiable as consistent with the familiar NOR architecture, although the subject invention is generally applicable to other memory architectures.

Figure 2:
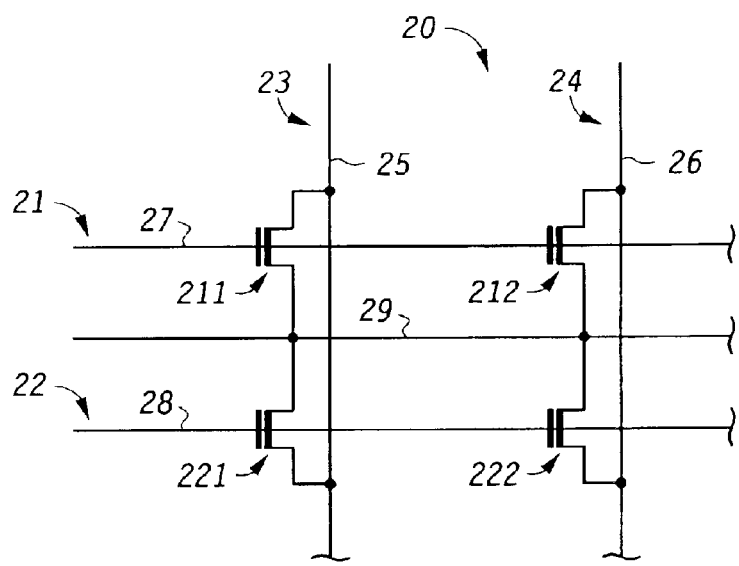
FIG. 2 is a circuit diagram of a small portion of an EEPROM array that incorporates a SONOS storage NVM cell.

Referring now to FIG. 2, those skilled in the art will recognize memory array 20 to include a plurality of rows 21, 22 . . . and a plurality of columns 23, 24 . . . For purposes of explication, the array may be arbitrarily assumed to be populated with 8-bit words and to have a sector size of 64K (65, 536) words. A memory array so dimensioned will therefore be populated by 512K cells. For the limited purposes of this Description, it may be conveniently assumed that the cells are, to the extent permitted by operative device fabrication processes, substantially identical in form and performance, save that individual cells tend to exhibit respective threshold voltages, including an erased $V_T$, that vary about a center value. For simplicity, only the first two rows, 21 and 22, and the first two columns, 23 and 24, of memory array 20 are shown in FIG. 2. Likewise, only four NVM cells, 211, 212, 221, and 222, respectively, are shown.

With continued reference to FIG. 2, it is seen that array 20 includes a first word line 27 that is sequentially coupled to the gate conductors of cell 211 and cell 212, as well as to the gate conductors of the remaining cells (not shown) that constitute row 21. A second word line 28 is likewise sequentially coupled to the gate conductors of cell 221 and of cell 222, as well as to the gate conductors of the remaining cells (not shown) that constitute row 22. A first bit line 25 is sequentially coupled to the drain of cell 211 and to the drain of cell 221, as well as to the respective drains of the remaining cells (not shown) that constitute column 23. A second bit line 26 is likewise sequentially coupled to the drain of cell 212 and to the drain of cell 222, as well as to the drains of the remaining cells (not shown) that constitute column 24. The respective sources of each of cells 211, 212, . . . , and 221, 222, . . . , that constitute rows 61 and 62 are commonly connected and are coupled to a source line 29. Those having routine familiarity with the design and operation of memory arrays understand that bit lines 25, 26 . . . are coupled to a sense amplifier (not shown) that determines the logic state of appropriately addressed memory cells by virtue of the drain-to-source current that flows in those cells. Similarly, those having such familiarity understand that the arrangement of cells illustrated in FIG. 2 is simply extrapolated to form the remaining rows of memory array 20 and that a corresponding source line is provided for each of the remaining row pairs. Schemes for addressing the contents of memory array 20 are deemed largely collateral to the invention and are, accordingly, not treated here. However, certain details regarding methods of programming, erasing, and reading the contents of memory array 20 are relevant, and are discussed below.

Application of the NVM cell of FIG. 1 in a memory array such as the NOR array of FIG. 2 necessarily involves the performance of three operations: programming the NVM cell, erasing the NVM cell, and reading data from the NVM cell. These functions are achieved through appropriately biasing the gate conductor, the source region, and the drain region of NVM cell to selected predetermined voltages.

In the embodiment of FIGS. 1 and 2, the NVM cell is programmed by applying a programming row-select voltage of 5V to gate conductor 124 of cells resident in a selected row. The voltage at the gate conductor of cells in an unselected row is approximately 0 volts. A programming column-select voltage of 5 volts is applied to the drains of cells in a selected column, and 5V is applied to the drains of cells in unselected columns.

The gate conductor is biased to a voltage level higher than the voltage level of the source region by an amount that is at least equal to the threshold voltage of the channel region 121 under the ONO stack. Thus, the channel region is switched on and is conductive. Negative charge carriers, e.g., electrons, originate from the source region and are accelerated through the channel region. When the electrons reach the portion of channel 121 adjacent to the drain region 116, they are attracted by the positive voltage at the gate conductor 124. In a hot-carrier injection process, the charge carriers (e.g., electrons) are injected across oxide layer 118 and are trapped in a portion of silicon nitride layer 120. As the negative charge carriers traverse the channel into silicon nitride layer 120, the threshold voltage of the channel region 121 increases. Thus, the current flowing through the channel region decreases, as does the rate of hot-carrier injection. After the programming voltages are removed from NVM cell, the injected carriers remain trapped in silicon nitride layer 120. A first logic value, e.g., a logic ZERO is stored in the NVM cell, i.e., the NVM cell is programmed.

In a conventional manner, all rows in a selected sector of NVM array 20 are simultaneously erased. A gate voltage of −6V is applied to gate conductor 124 of cells in the selected sector, and an erase bias voltage of 5V is applied to the substrate. The source and drain of each cell are allowed to float. (Be aware that the above-stated erase conditions are typical of a flash EEPROM predicated on a SONOS NVM cell structure. Different cell structures can be expected to require other erase conditions.)

Because, during an erase operation, the gate conductor is at a voltage that is negative with respect to the drain, channel portion 121 is assured to be nonconductive. In addition, because the positive voltage is applied in the substrate, a strong electric field is established in the channel region across the dielectric stack. The strong electric field enables charge trapped in the nitride region to tunnel through the bottom dielectric layer. Preferably, the erasing process continues until silicon nitride layer 120 becomes substantially electrically neutral or positively charged. After the erasing voltages are removed from the NVM cell, silicon nitride layer 120 remains substantially neutral. In either case, a second logic value, e.g., a logic ONE, is imparted to the NVM cell; i.e., the NVM cell is erased.

In the course of the read operation, a read row-select voltage of approximately 1.2V is applied to the gate conductor of each NVM cell in a selected row. Similarly a read column-select voltage of 0.5 to 1.2V is applied to the drain of each NVM cell resident in the selected column. The read bias voltage at the source region of each NVM cell is at 0V. Current will flow only if the ONO stack has been erased so that charge-storage sites of nitride layer 120 are neutral or are populated with holes. If the cell had previously been programmed (without an intervening erase), charge-storage sites will be populated with electrons, the threshold voltage of the cell will be high, and no current will flow.

If the NVM cell has been programmed, the silicon nitride layer under the gate conductor will be negatively charged. Channel portion 121 will then have a threshold voltage that is higher than the intrinsic (i.e., charge-neutral) threshold voltage that obtains when the silicon nitride layer under the charge-storage gate is substantially neutral. If the NVM cell has been erased, the silicon nitride layer is substantially neutral or positively charged. In this case, channel portion 121 has a threshold voltage that is substantially equal to or lower than its intrinsic threshold voltage. The READ voltage is preferably lower than the threshold voltage of channel portion 121 if NVM cell has been programmed. In addition, the READ voltage is preferably higher than the threshold voltage of the channel if the NVM cell has been erased. Therefore, when reading data from a programmed NVM cell, the channel region is nonconductive, and the current level flowing through the channel is low, e.g., equal to or less than approximately 2 microamperes ($\mu A$). A sense amplifier (not shown) coupled to drain region via a bit line (see FIG. 2) senses the low-level current and reads the first logic value, e.g., logic ZERO, from NVM cell. On the other hand, when reading data from an erased NVM cell, channel region 121 is conductive, and the current flowing therethrough is relatively large, e.g., equal to or greater than approximately 10 $\mu A$. The sense amplifier (not shown) coupled to the drain region senses the large current and reads the second logic value, logic ONE, from the NVM cell.

The above explication directed to the manner in which an NVM cell is operated (i.e., programmed, read and erased) has been included herein primarily to promote a thorough understanding of the context in which the subject invention arises. In pertinent part, an understanding of the physical and electrical mechanisms associated with NVM cell operation is intended to facilitate both an appreciation of the operational difficulties that derive from the variances among erased threshold voltages exhibited by individual cells in an NVM array, as well as an appreciation of the value of the subject invention in remediation of those difficulties.

In this regard, those acquainted with the operation of semiconductor memory devices are well aware that flash EEPROM memory arrays are typified by certain unique features. In particular, the operation of flash EEPROM is markedly different from random access memories (RAMs) in that, rather than random programming on a byte-by-byte basis, programming of flash EEPROM occurs episodically, and relatively infrequently. Further, flash EEPROM erase is conducted on a global, or sector-by-sector, basis. Programming is almost invariably anticipated by a global erase of all cells in the array. With this in mind, it will be made clear that the subject invention represents a significant advancement in the manner in which NVM arrays, including, but not limited to flash EEPROM arrays, are erased.

Figure 3:
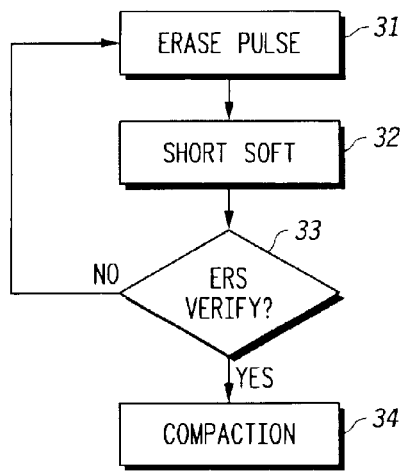
FIG. 3 is a flow diagram that illustrates the manner in which a cell erasure operation, with compaction, is performed in accordance with the subject invention.

FIG. 3 is a flow diagram presenting the manner in which an NVM array is erased so that the distribution of erased threshold voltages of cells in the array is caused to more closely converge on a predetermined target erased threshold voltage. Referring now to FIG. 3, at step 31 an erase pulse is applied to the gate conductors of selected cells in the array. For convenience, and in order to avoid unnecessary complexity, assume that the NVM array is erased on a sector basis. In this case, an erase pulse having an amplitude of approximately −6V and duration of 100 ms is applied to bit lines 61, 62, . . . of the cells in all columns of a given sector.

Subsequent to the erase pulse, at step 32 an optional soft programming procedure is performed in order to prevent over-erasure of cells. In one embodiment, soft programming requires the application of a bias voltage of, for example, 5.0V to the bit line of a column in the array. With the bias voltage applied to the column, a predetermined soft program voltage is applied to the gate conductors of cells in the selected column. In one embodiment, the soft program voltage is the voltage that corresponds to minimum allowable erased $V_T$ of cells in the array. The minimum allowable erased $V_T$ may be, for example, −2.0V. The current conducted by the cell is then determined under the above bias conditions. If the current is appreciable (for example, greater than 1.0 $\mu A$), then it may be safely concluded that the corresponding cell has been erased to a $V_T$ that is less than the minimum allowable erased $V_T$. If so, threshold-correction voltages are simultaneously applied to the gate and drain that are effective to shift the erased $V_T$ in the positive direction. In one embodiment, the threshold-correction voltages are 3V to the gate and 5V to the drain, respectively. In a manner that will be made fully clear below, soft programming has the salutary effect of urging the erased $V_T$ of cells back into a range that is susceptible to compaction.

Subsequent to the application of an erase pulse at Step 31, as well as the optional soft programming at Step 32, an erase verify step is performed at Step 33. Step 33 determines whether erasure was effective. That is, Step 33 determines whether every (putatively) erased cell has been erased to a $V_T$ below an erase-verified threshold voltage, $V_{ERS(v)}$. Erase verification is performed by measuring the current conducted by an erased cell. Specifically, a voltage equal to $V_{ERS(v)}$ is applied to the gate conductors of cells in the array. If the $V_T$ of the "erased" cell is not below $V_{ERS(v)}$, then an erase failure will be indicated by failure of the cell to conduct current above a predetermined level. Recall that nonconduction, by convention, corresponds to a logic ONE; that is, appreciable current conduction connotes that the cell has not been effectively erased. As illustrated in FIG.3, when a determination is made that erasure is not been achieved subsequent to an erase pulse, then the erase operation returns to Step 31. Another erase pulse is applied. When a determination is made at Step 33 that erasure has been achieved, the erase operation proceeds to Step 34.

At Step 34, compaction of the threshold voltages of erased cells is effected by applying, either on a bit-by-bit or column-by-column basis, to all cells in the array a gate voltage that is equal to the target erased $V_T$. For example, if the target erased $V_T$ of cells is 0V, then 0V is applied to the gates of all cells in the NVM array for a predetermined length of time. Coterminous with the specified gate voltage, a relatively high drain bias, approximately 3V to 5V, is applied to the drains of the NVM cells.

The target erased $V_T$ is the charge-neutral $V_T$ of the NVM cells and, by design, can be expected to reside within the range of −2V to +2V, although other values are possible without departure from the invention. The charge-neutral $V_T$ (or, alternatively, "intrinsic" $V_T$) of the NVM cell is the $V_T$ that is exhibited when the charge-storage sites in layer 120 of the NVM cell are ubiquitously vacant. In this state, none of the charge-storage sites of layer 120 are populated by a hole or an election. The charge-neutral $V_T$ of the cells is controllable in response to a number of device parameters, primarily the doping of channel 119.

Figure 4:
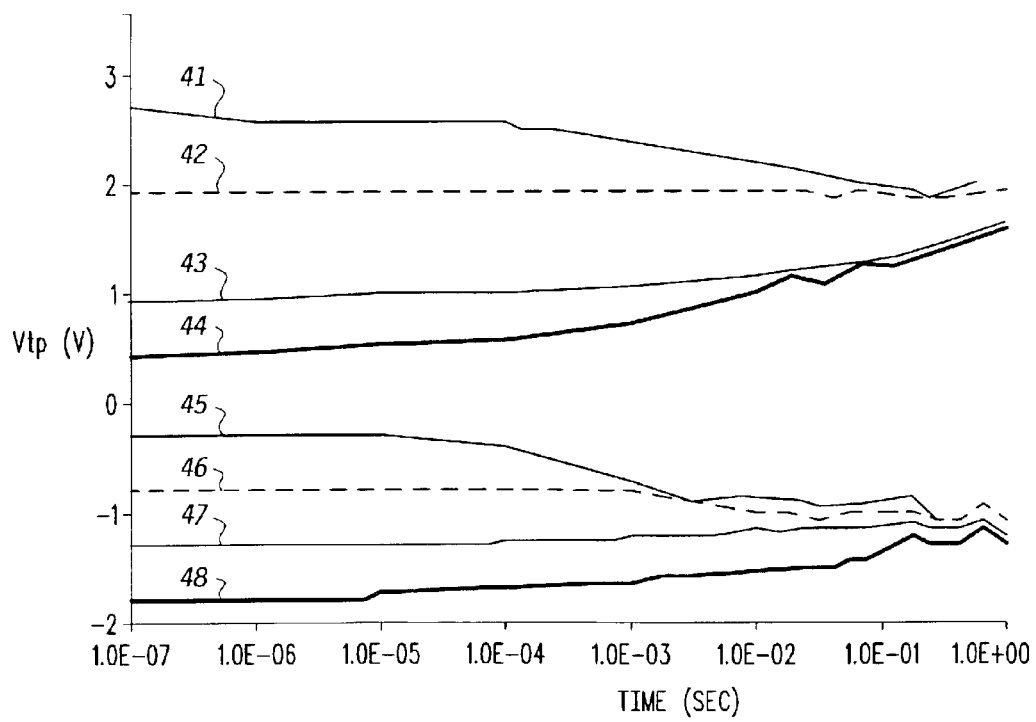
FIG. 4 illustrates the time response of erased $V_T$ in the direction of the target erased $V_T$. Examples depict the manner in which two sets of cells, each set initially exhibiting a number of different threshold voltages, are caused to converge to two, respective, target erased $V_T$.

Application of the target erased $V_T$ to the gates of the NVM cells is sustained for a predetermined period of time that has been occasionally referred to as the "drain-stress" time. In general, the drain-stress time may be defined as a length of time adequate to achieve the desired degree of compaction, or convergence, in the distribution of erased threshold voltages of cells in the array. Drain-stress time may be determined by simulation, informed by empirical investigation. FIG. 4 graphically illustrates the manner in which the erased $V_T$ of an NVM cell can, over time, be driven in the direction of the target erased $V_T$ by sustained application of a fixed gate voltage, that is equal to the target erased $V_T$.

FIG. 4 illustrates the variation, over time, of erased threshold voltage of an NVM cell. In FIG. 4, the horizontal axis represents drain-stress time and has a range of 1.0 E-07 seconds to 1.0 second. The vertical axis represents the threshold voltage of the cell. The value of threshold voltage at the horizontal origin is the value of the $V_T$ of the cell prior to compaction. On FIG. 4, lines 41, 42, 43 and 44 demonstrate the convergence, over the drain-stress time, of the cell $V_T$ from initial values of 3V, 2V, 1V and 0.5V, respectively, to a target erased $V_T$ of 2.0V. So, for example, line 44 demonstrates the manner in which a cell having an initial threshold voltage 0.5V is caused to acquire a $V_T$ of only slightly less than the target erased $V_T$, 2.0V, over an elapsed drain-stress time of one second. Similarly, lines 45, 46, 47, and 48 of FIG.4 demonstrate the convergence, over the duration of the drain-stress time, of a cell having a $V_T$, at the drain-stress time origin, of –0.3V, –1.0V, –1.5V and –2.0V, respectively, to a target erased $V_T$ of –1.0V. Accordingly, FIG. 4, at lines 41 through 44, indicates that cells having initial threshold voltages in the range of 0.5V to 3.0V may be caused to acquire an erased $V_T$ very nearly equal to a target erased $V_T$ of 2.0V. Similarly, FIG. 4, at lines 45 through 48, indicates that cells having initial threshold voltages in the range –0.3V to –2.0V may be caused to acquire an erased threshold voltage very nearly equal to a target erased $V_T$ of –1.0V.

Although the value of the above-described compaction scheme is indisputable, a limited disclaimer is in order. Specifically, compaction, as currently contemplated, provides a very useful, albeit not unlimited, range of effectiveness. That is to say, if the starting threshold voltage of an NVM cell is excessively removed from the target erased $V_T$, then effective convergence of the cell $V_T$ to the target erased $V_T$ may not be realizable. Accordingly, the ability to drive a cell $V_T$ from a value that is more than approximately 2.0 volts removed from the target erased $V_T$ is somewhat problematic. However, it is in this regard that the soft program step (step 32 in FIG. 3) described above is particularly beneficial. Because soft programming prior to compaction is effective to bring the initial $V_T$ of the cell nearer the target erased $V_T$, soft programming reduces the number of recalcitrant cells that are unreceptive to compaction. That is, even if the initial cell $V_T$ resides outside the compaction range, soft programming may effect a sufficient movement of the cell $V_T$ so that the cell is brought within the capture range of the compaction Step 34.

Figure 5:
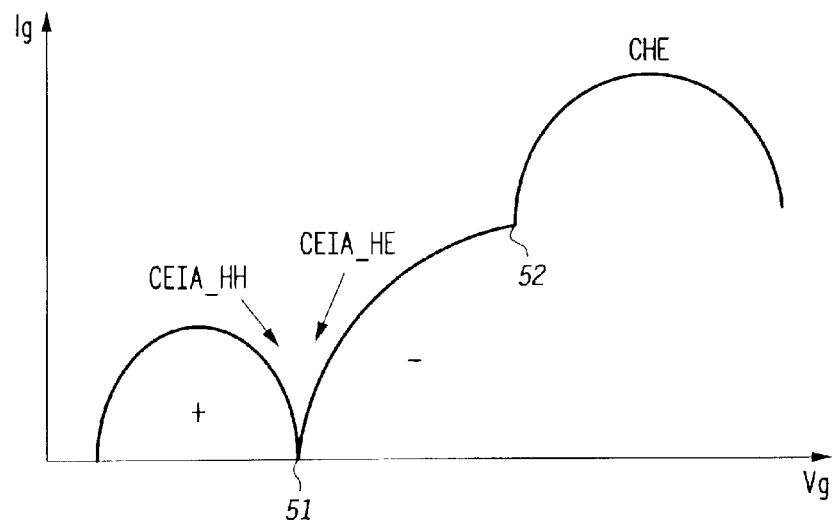
FIG. 5 is a graphical representation of gate current (Ig) as a function of gate voltage (Vg) for an N-type MOS transistor, revealing the manner in which hole/electron balancing may be employed as a mechanism for erased $V_T$ compaction.

FIG. 5 is a graphical representation of gate current (Ig) as a function of gate voltage (Vg) for an N-type MOS transistor. Ig is a measure of the flow of either electrons or holes into the charge-storage layer. Vg is the voltage applied to the gate conductor. FIG. 5 reveals that this function contains two inflection points 51 and 52 that occur at gate voltages Vg1 and Vg2 respectively. The gate current characteristics illustrate that channel-electron, induced avalanche, hot-hole (CEIA-HH) injection occurs at gate voltages below Vg1. Channel electron, induced-avalanche, hot-electron injection (CEIA-HE) occurs at gate voltages between Vg1 and Vg2. Channel, hot-electron injection (CHE) occurs when gate bias voltage is appreciably greater than Vg2. Of paramount interest here: CEIA-HH and CEIA-HE are in balance when the gate voltage is equal to Vg1. This balance is attained because a voltage at the floating gate, $V_{FG}$, greater than Vg1 causes electrons to be injected into the nitride layer. $V_{FG}$ then decreases gradually, until finally reaching Vg1. If $V_{FG}$ is less than Vg1, holes are injected into the nitride layer, causing $V_{FG}$ to increase until its value again reaches Vg1.

Figure 6:
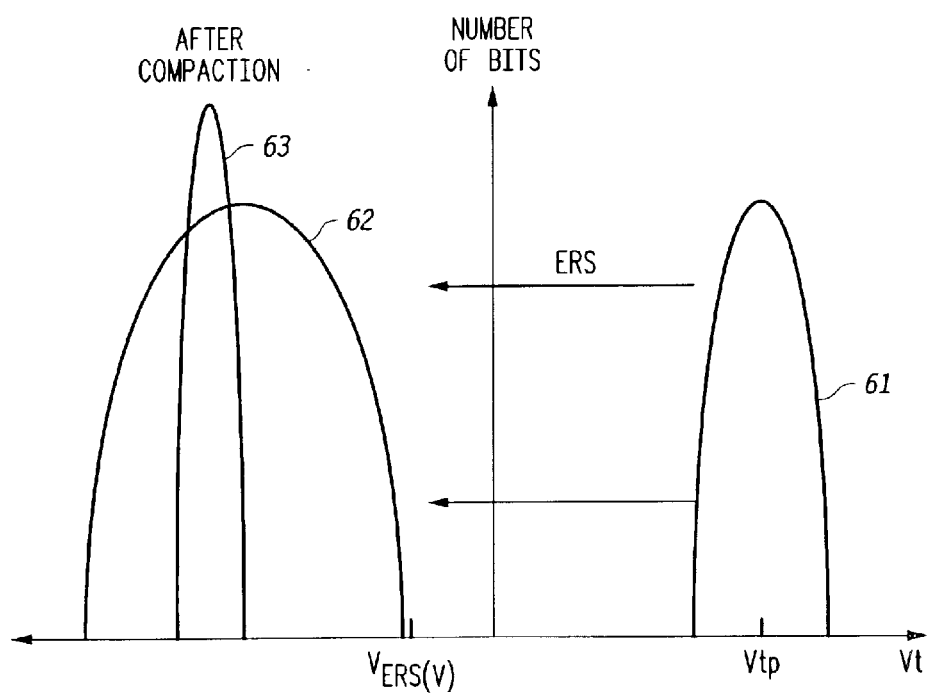
FIG. 6 is a graphical representation of the effect of compaction on the distribution of erased $V_T$ of cells in an NVM array.

FIG. 6 graphically illustrates the effect of the subject erasure technique, incorporating compaction as described herein, on the distribution of NVM cell threshold voltages. In FIG. 6, curve 61 represents the distribution of NVM threshold voltages typically encountered cell threshold voltages after a programming operation. Note that the distribution approximately conforms to a binomial distribution around a nominal programmed threshold voltage $V_{tp}$. Consequently, the number of cells (bits) that exhibit a programmed threshold voltage less than $V_{tp}$ is roughly equal to the number of cells (bits) that exhibit a programmed threshold voltage greater than $V_{tp}$.

Curve 62 represents the distribution of cell threshold voltages after erasure, but without the benefit of compaction. In FIG.6, $V_{ERS(v)}$ is the verify erase threshold voltage alluded to above. Note that, without compaction, even though all bits have an erased $V_T$ that is less than $V_{ERS(v)}$, the distribution (standard deviation) of erased $V_T$ is relatively broad.

Curve 63 reflects the erased $V_T$ distribution after compaction and dramatically highlights the ameliorative effects of compaction. Note that the distribution of erased $V_T$ is substantially more confined than the distribution that is achieved without compaction.

It should not be assumed, however, that all the cells in the NVM array are necessarily compacted so as to have an erased $V_T$ within the desired predetermined range. As indicated above, the behaviour of cell erased $V_T$ in the main conforms in the main to binomial statistics. Consequently, even after compaction, there may exist a small, but non-zero, probability that a given cell will have an erased $V_T$ that resides outside a finite predetermined range. So, to say that compaction causes the erased $V_T$ distribution to be "confined" to a predetermined range simply means that no more than an acceptably limited number of cells have an erased $V_T$ that is outside the range.

From another perspective, FIG. 4 indicates that the degree of compaction that is achieved varies as a function of the drain-stress time. Therefore, the attainment of a more confined distribution around the target erased $V_T$ requires a longer drain-stress duration. The process designer, for reasons that may be collateral to, or inconsistent with, the objective of erased $V_T$ compaction, may in his judicious discretion elect to truncate the applied drain-stress time. In this instance, it might be reasonably inferred that the erased $V_T$ of some cells will not be compacted fully into desired predetermined range of $V_T$ values.

It is also noteworthy that compaction causes the "most-erased" cells to have a much less negative erased $V_T$, thereby tending to minimize over-erasure anomalies. Over-erasure may arise when, in the process of erasing the contents of an NVM cell, and in an attempt to ensure thorough removal of carries (e.g., electrons) previously injected in a programming step, the erasure operation is sustained for a prolonged duration. As a result, an excessive amount of charge will be removed, so that a net positive charge exists in the charge-storage layer of the cell. The $V_T$ of the erased cell can then become excessively negative, causing the NVM cell to become, in effect, a depletion-mode transistor that conducts current, even in the absence of the positive voltage at the gate conductor.

In addition, over-erased cells impose an excessive current load on the charge pump. Charge pumps are provided in NVM systems to, inter alia, temporarily boost the available supply voltage to a (generally more positive) level that is more effective in programming NVM cells. Because the current conducted by a MOS transistor is roughly proportional to the differential gate-to-threshold voltage, when the transistor $V_T$ is excessively negative, the differential that results from the application of a given gate voltage will be greater than desired, and consequently, substantial current will be drawn from the charge-pumped drain voltage supply, causing the drain supply voltage to discharge. In the extreme, the drain supply voltage can discharge to a level that precludes reliable programming of the NVM cells.

Accordingly, from the Description above, it should be clear that the subject Compaction Scheme in NVM, in its numerous embodiments, is noteworthy in the many features, advantages and capabilities if offers. Compaction of the erased cell $V_T$ distribution mitigates programming column leakage current and unselected read leakage. Prior responses to these unwanted effects, one of which is predicated on iterative erase/verify/erase sequence, are known to in fact broaden the statistical distribution in erased cell $V_T$.

The prefatory (optional) soft programming step extends the capture range of compaction so that when compaction is anticipated by soft programming, compaction is effective even with respect to NVM cells that exhibit an initial erased $V_T$ that is distant from the target erased $V_T$.

The subject erasure technique effects true convergence in erased cell $V_T$ substantially indiscriminately for both positive and negative target erased threshold voltages.

Furthermore, the invention has been described here in the context of a SONOS type NVM cell. It should not be inferred, however, that the invention is limited to a particular form of NVM cell architecture. The compaction scheme described here is directly applicable to other NVM cell structures, such as SONOS and Q-flash, that incorporate a thin-film, high-K dielectric stack for data storage. The invention is also relevant to floating-gate NVM cell structures, provided that the bottom oxide layer is sufficiently thin to support CEIA_HH and CEIA_HE.

In the Description above, the invention has been set forth in the context of specific numerous embodiments, in a manner that is intended to be illustrative and to convey a thorough comprehension of the invention. However, one of ordinary skill in the art pertaining to the design and fabrication of semiconductor nonvolatile memory devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and thicknesses identified herein. Similarly, those skilled in the art understand that conductivity types (P-type, N-type) may, in general, be reversed, provided that requisite consistency is preserved. Accordingly, the Description and the Figures are properly construed as illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

I claim:

1. A method of erasing a nonvolatile memory (NVM) that includes a plurality of NVM cells, each cell having a gate, a source, a drain, and a channel between the source and the drain, the method comprising:
   (a) applying an erase pulse to the NVM cell;
   (b) determining whether erasure was effective; and
   (c) if erasure is determined to be effective, compacting threshold voltages of NVM cells;
   wherein compacting the threshold voltages of erased NVM cell is effected by applying to NVM cells a gate voltage that is approximately equal to a target erased threshold voltage and sustaining the application of the gate voltage for a predetermined time.

2. A method of erasing an NVM as defined in claim 2, wherein the predetermined time is a length of time sufficient to cause the distribution of erased threshold voltages NVM cells to be confined to a specified range.

3. A method of erasing an NVM as defined in claim 2, wherein the predetermined length of time is sufficient to balance channel electrons and holes in charge-storage layer of the NVM cells.

4. A method of erasing an NVM as defined in claim 2, wherein a soft program step is performed on the NVM after step (a) and prior to step (c) and wherein compacting the threshold voltages of erased NVM cell is effected by applying to NVM cells a gate voltage that is approximately equal to a target erased threshold voltage and sustaining the application of the gate voltage for a predetermined time.

5. A method of erasing an NVM as defined in claim 1, wherein a soft program step is performed on the NVM after step (a) and prior to step (b) and wherein compacting the threshold voltages of erased NVM cell is effected by applying to NVM cells a gate voltage that is approximately equal to a target erased threshold voltage and sustaining the application of the gate voltage for a predetermined time.

6. A method of erasing an NVM as defined in claim 5, wherein the predetermined time is a length of time sufficient to cause the distribution of erased threshold voltages NVM cells to be confined to a specified range.

7. A method of erasing an NVM as defined in claim 6, wherein the predetermined length of time is sufficient to balance channel electrons and holes in charge-storage layer of the NVM cells.

8. An array of nonvolatile memory (NVM) cells arranged in a plurality of columns and plurality of rows, each memory cell comprising:
   body of semiconductor material having a surface;
   a drain formed in the body beneath the surface;
   a source formed in the body beneath the surface, the drain and the source defining a channel therebetween;

a gate dielectric disposed on the surface over at least a portion of the channel, the gate dielectric comprising an ONO stack;

a gate conductor overlying the gate dielectric;

a first bit line coupled to the drain of each NVM cell in a first column of the plurality of columns;

a second bit line coupled to the drain of each NVM cell in a second column of the plurality of columns;

a first word line coupled to the gate conductor of each memory cell in a first row of the plurality of rows:

a second word line coupled to the gate conductor of each memory cell in a second row of the plurality of rows;

a source line coupled to the source of each NVM cell in the first row and to the source of each NVM cell in the second row;

a first voltage source coupled to both the first word line and to the second word line, the first voltage source providing first voltage approximately equal to a target erased threshold voltage; and a second voltage source coupled to the first bit line, the second voltage source providing a second voltage that is greater than the first voltage.

9. An array of NVM cells as defined in claim 8, wherein each of the NVM cells has been subjected to an erase operation that has not been succeeded by a program operation and the NVM cells exhibit a distribution of erased threshold voltages that is compacted about the target erased threshold voltage.

10. A method of erasing a nonvolatile memory (NVM) cell having a gate, a source, and a drain, the method comprising:

applying an erase signal to the NVM cell;

applying a signal to the NVM cell so as to impede over-erasure of the cell;

determining whether the NVM cell is effectively erased; and applying a compaction signal to the NVM cell;

wherein over-erasure of the NVM cell is impeded by applying a soft program signal to the NVM cell; and wherein the soft program signal comprises a voltage approximately equal to a target most-erased threshold voltage coupled to the gate and a positive voltage coupled to the drain.

11. A method of erasing a nonvolatile memory (NVM) cell having a gate, a source, and a drain, the method comprising:

applying an erase signal to the NVM cell;

applying a signal to the NVM cell so as to impede over-erasure of the cell;

determining whether the NVM cell is effectively erased; and applying a compaction signal to the NVM cell;

wherein the compaction signal comprises a voltage approximately equal to a target erased threshold voltage coupled to the gate and a positive voltage coupled to the drain.

12. A method of crasing an NVM cell as defined in claim 11, wherein the compaction signal is applied to the NVM cell for a dine adequate to cause the erased threshold voltage of the cell to have a value within a predetermined range around the erased target voltage.

13. A method of erasing an NVM cell as defined in claim 11, wherein current flowing between the drain and the source is sensed in order to determine whether the NVM cell is effectively erased.

14. A method of erasing an NVM cell as defined in claim 11, wherein over-erasure of the NVM cell is impeded by applying a soft program signal to the NVM cell.

15. A method of erasing an NVM cell as defined in claim 14, wherein the soft program signal comprises a voltage approximately equal to a target most-erased threshold voltage coupled to the gate and a positive voltage coupled to the drain.

16. In a semiconductor nonvolatile memory (NVM) that comprises a plurality of NVM cells, each all having a drain, a source, a channel between the gate and the source, a gate dielectric in the form of an ONO stack disposed over at least a portion of the channel, and a gate conductor overlying the gate dielectric, a method of erasing the NVM by successively performing the steps:

(a) applying an erase pulse to an NVM cell;

(b) soft programming the NVM cell;

(c) determining whether the NVM cell is erased;

(d) repenting steps (a), (b) and (c); and (e) applying to the gate conductor, for a predetermined length of time, a target erased threshold voltage.

17. A method as defined in claim 16, wherein the target erased threshold voltage is applied to the gate conductor for a length of time that causes a distribution of erased threshold voltages of NVM cells to be substantially confined to a predetermined range around the target erased threshold voltage.

18. method as defined in claim 17, wherein the target erased threshold voltage is applied to the gate conductor for a length of time that causes holes and electrons in a charge-storage layer of the ONO stack to become substantially balanced.

19. A method as defined in claim 16, wherein soft programming the NVM cell causes the NVM cell threshold voltage to be moved toward a target programmed threshold voltage.

* * * * *

UNITED STATES PATENT AND TRADEMARK OFFICE
CERTIFICATE OF CORRECTION

| | | |
|---|---|---|
| PATENT NO. | : 6,836,435 B2 | Page 1 of 1 |
| APPLICATION NO. | : 10/319664 | |
| DATED | : December 13, 2002 | |
| INVENTOR(S) | : Chi Nan Brian Li | |

It is certified that error appears in the above-identified patent and that said Letters Patent is hereby corrected as shown below:

In Column 14, Line 9, Claim 12:
    Change "for a dine" to --for a time--

In Column 14, Line 43, Claim 18:
    Change "method as" to --A method as--

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,836,435 B2  Page 1 of 1
APPLICATION NO. : 10/319664
DATED : December 28, 2004
INVENTOR(S) : Chi Nan Brian Li It is certified that error appears in the above-identified patent and that said Letters Patent is hereby corrected as shown below:

In Column 14, Line 9, Claim 12:
  Change "for a dine" to --for a time--

In Column 14, Line 43, Claim 18:
  Change "method as" to --A method as--

This certificate supersedes the Certificate of Correction issued May 27, 2008.

Signed and Sealed this

Twenty-fourth Day of June, 2008

JON W. DUDAS
*Director of the United States Patent and Trademark Office*